United States Patent
Remmele et al.

(10) Patent No.: US 9,459,334 B2
(45) Date of Patent: Oct. 4, 2016

(54) SYSTEM AND METHOD FOR CLASSIFYING TISSUE OXYGENATION PROPERTIES BASED ON CLUSTER ANALYSIS OF THE MULTI-PARAMETRIC MR RESPONSE TO AN OXYGEN BREATHING CHALLENGE

(71) Applicant: KONINKLIJKE PHILIPS N.V., Eindhoven (NL)

(72) Inventors: Stefanie Remmele, Landshut (DE); Julien Senegas, Hamburg (DE); Jochen Keupp, Rosengarten (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/421,861

(22) PCT Filed: Aug. 28, 2013

(86) PCT No.: PCT/EP2013/067848
§ 371 (c)(1),
(2) Date: Feb. 16, 2015

(87) PCT Pub. No.: WO2014/033185
PCT Pub. Date: Mar. 6, 2014

(65) Prior Publication Data
US 2015/0204956 A1 Jul. 23, 2015

Related U.S. Application Data

(60) Provisional application No. 61/693,797, filed on Aug. 28, 2012, provisional application No. 61/806,475, filed on Mar. 29, 2013.

(51) Int. Cl.
*G06K 9/00* (2006.01)
*G01R 33/50* (2006.01)
(Continued)

(52) U.S. Cl.
CPC ............. *G01R 33/50* (2013.01); *G01R 33/385* (2013.01); *G01R 33/546* (2013.01); *G01R 33/56* (2013.01); *G01R 33/5601* (2013.01); *G01R 33/5608* (2013.01); *G06T 15/08* (2013.01)

(58) Field of Classification Search
CPC .............. G01R 33/50; G01R 33/5601; G01R 33/5608; G01R 33/546; G01R 33/56; G01R 33/385; G06T 15/08
USPC ........................................................ 382/131
See application file for complete search history.

(56) References Cited

FOREIGN PATENT DOCUMENTS

WO 2010113061 A1 10/2010

OTHER PUBLICATIONS

Remmele, S. et al "Novel MR Method to Detect Non-Normoxic Tissue based on Cluster Analysis of the Dynamic R2* and R1 Response to a Hyperoxic Respiratory Challenge" Proceedings of the International Society Foro Magnetic Resonance in Medicine, Apr. 2012, pp. 2350.*

(Continued)

*Primary Examiner* — Gregory F Cunningham

(57) ABSTRACT

A magnetic resonance (MR) imaging system (600) for generating information indicative of an MR response to an oxygen breathing challenge, the MRI (600) system comprising at least one controller (610) which is configured to define a reference region (302) within a region of interest (ROI) (300 A) of reconstructed MR image information (300) including a plurality of voxels, the reference region (302) comprising a plurality of reference voxels selected from the plurality of voxels, each of the plurality of voxels having associated $\Delta R_2^*$ and $\Delta R_1$ values; select a cluster of voxels comprising voxels from at least the reference voxels from a multiparametric $\Delta R_2^*$ and $\Delta R_1$ mapping of the plurality of voxels; determine $\Delta R2^*$ and $\Delta R\backslash$ limit points based upon at least minimum $\Delta R_2^*$ and $\Delta R_1$ values of voxels of the cluster of voxels; and determine outlier voxels (115) based upon a comparison of $\Delta R_2^*$ and $\Delta R_1$ of at least one of the plurality of voxels with respective values of the $\Delta R_2^*$ and $\Delta R_1$ limit points.

20 Claims, 6 Drawing Sheets

(51) Int. Cl.
    G01R 33/56    (2006.01)
    G01R 33/385   (2006.01)
    G01R 33/54    (2006.01)
    G06T 15/08    (2011.01)

(56) References Cited

OTHER PUBLICATIONS

"Novel Contrast Agents and Strategies for MR Molecular Imaging", Dec. 2008, Retrieved from Internet on Jun. 13, 2016, retrieved from <URL:https://pure.tue.nl/ws/files/3078258/200910004.pdf>.*

Remmele, S. et al "Dynamic and Simultaneous MR Measurement of R1 and R2* changes during Respiratory Challenges for the Assessment of Blood and Tissue Oxygenation", Magnetic Resonance in Medicine, vol. 70. No. 1, Aug. 2012, pp. 136-146.

Chang, Kevin J. et al "Applications of Quantitative T1, T2, and Proton Density to Diagnosis", Applied Radiology, vol. 34, No. 1. Jan. 2005, pp. 34-42.

Ding, Y. et al "Interleaved T1 and T2* weighting Imaging Can Evaluate Dynamic Oxygen Challenge: A Feasibility Study", Proceedings International Society Magentic Resonance in Medicinesmrm, 2010.

Burrell, J.S. et al "Investigating ΔR1 and ΔR2* Biomarkers of Tumour Oxygenation", Proceedings International Society Magentic Resonance in Medicine, 2010.

Remmele, S. et al "Classification of Tissue Oxygenation Properties based on Simultaneous Dynamic ΔR1 and ΔR2* D(C)O2E-MRI" Proceedings International Society Magentic Resonance in Medicine, vol. 19, 2011, pp. 4270.

* cited by examiner

SYSTEM AND METHOD FOR CLASSIFYING TISSUE OXYGENATION PROPERTIES BASED ON CLUSTER ANALYSIS OF THE MULTI-PARAMETRIC MR RESPONSE TO AN OXYGEN BREATHING CHALLENGE

This application is the U.S. National Phase application under 35 U.S.C. §371 of International Application No. PCT/EP2013/067848, filed on Aug. 28, 2013 which claims the benefit of U.S. Provisional Patent Application No. 61/693,797, filed Aug. 28, 2012 and U.S. Provisional Patent Application No. 61/806,475, filed Mar. 29, 2013, the entire contents of each of which are incorporated herein by reference.

Exemplary embodiments of the present invention generally relate to magnetic resonance imaging (MRI) systems for non-invasively determining tissue oxygenation and vasoreactivity characteristics and, more particularly, to MRI systems for differentiating between normoxic and non-normoxic tissue using a gas-enhanced magnetic resonance (MR) method, and a method of operation thereof.

Currently, there is interest in dynamic oxygen ($O_2$) or carbon dioxide ($CO_2$) enhanced MRI methods for the assessment of tissue oxygenation and vasoreactivity. This assessment may be critical for selection of cancer treatments as the efficiency of certain radiation therapies can depend on the oxygenation level of tumors. Conventionally, gas-enhanced MRI measures changes of relaxation parameters $\Delta R_2^*$ and/or $\Delta R_1$ in response to a breathing challenge in which oxygen-enriched gases such as $O_2$, $CO_2$, and/or carbogen are delivered to a subject under test (SUT) such as a patient. Unfortunately, these two breathing parameters are typically analyzed independently of each other rather than using a multi-parametric approach.

The system(s), device(s), method(s), user interface(s), computer program(s), processes, etc. (hereinafter each of which will be referred to as system, unless the context indicates otherwise), described herein address problems in prior art systems.

In accordance with an aspect of the present system there is described a magnetic resonance (MR) imaging (MRI) system for generating information indicative of an MR response to an oxygen breathing challenge, the MRI system may include at least one controller configured to define a reference region within a region of interest (ROI) of reconstructed MR image information including a plurality of voxels, the reference region including a plurality of reference voxels selected from the plurality of voxels, each of the plurality of voxels having associated $\Delta R_2^*$ and $\Delta R_1$ values; select a cluster of voxels including voxels from at least the reference voxels from a multiparametric $\Delta R_2^*$ vs $\Delta R_1$ mapping of the plurality of voxels; determine $\Delta R_2^*$ and $\Delta R_1$ limit points based upon at least minimum $\Delta R_2^*$ and $\Delta R_1$ values of voxels of the cluster of voxels; and determine outlier voxels based upon a comparison of $\Delta R_2^*$ and $\Delta R_1$ of at least one of the plurality of voxels with respective values of the $\Delta R_2^*$ and $\Delta R_1$ limit points.

It is also envisioned that the at least one controller may further be configured to generate an outlier map including an underlay image and information based upon the determined outlier voxels overlayed thereon. Further, the MRI system may further include at least a display, wherein the at least one controller renders the outlier map on the display. It is also envisioned that the at least one controller may highlight the information based upon the determined outlier voxels. In accordance with embodiments of the present system, the $\Delta R_2^*$ and $\Delta R_1$ limit points define at least part of an outlier region. Further, the controller may be configured to select all voxels from the outlier region to be the outlier voxels. Moreover, the cluster of voxels may be selected in accordance with cluster rules.

In accordance with embodiments of the present system, a method of generating information indicative of an MR response to an oxygen breathing challenge performed by a magnetic resonance (MR) imaging system, the method may be performed by at least one controller of the MR imaging system and may include one or more acts of defining a reference region within a region of interest (ROI) of reconstructed MR image information including a plurality of voxels, the reference region including a plurality of reference voxels selected from the plurality of voxels, each of the plurality of voxels having associated $\Delta R_2^*$ and $\Delta R_1$ values; selecting a cluster of voxels including voxels from at least the reference voxels from a multiparametric $\Delta R_2^*$ vs $\Delta R_1$ mapping of the plurality of voxels; determining $\Delta R_2^*$ and $\Delta R_1$ limit points based upon at least minimum $\Delta R_2^*$ and $\Delta R_1$ values of voxels of the cluster of voxels; and determining outlier voxels based upon a comparison of $\Delta R_2^*$ and $\Delta R_1$ of at least one of the plurality of voxels with respective values of the $\Delta R_2^*$ and $\Delta R_1$ limit points.

It is further envisioned that the method may include an act of generating an outlier map including information based upon an underlay image and information based upon the determined outlier voxels overlayed thereon. Moreover, the method may further include an act of rendering the outlier map on a display. Further, the method may include an act of highlighting the information based upon the determined outlier voxels. It is also envisioned that the method may include an act of defining an outlier region using at least the $\Delta R2^*$ and $\Delta R1$ limit points. Further, the act of determining the outlier voxels may include an act of selecting all voxels in the outlier region to be the outlier voxels. Moreover, the act of selecting the cluster of voxels may be performed in accordance with cluster rules.

In accordance with yet further aspects of the present system, there is described a computer program stored on a computer readable memory medium, the computer program configured to generate information indicative of an MR response to an oxygen breathing challenge performed by a magnetic resonance imaging (MRI) system having main coils, gradient coils, and radio frequency (RF) transducers, the computer program may include a program portion configured to define a reference region within a region of interest (ROI) of reconstructed MR image information including a plurality of voxels, the reference region including a plurality of reference voxels selected from the plurality of voxels, each of the plurality of voxels having associated $\Delta R_2^*$ and $\Delta R_1$ values; select a cluster of voxels including voxels from at least the reference voxels from a multiparametric $\Delta R_2^*$ vs $\Delta R_1$ mapping of the plurality of voxels; determine $\Delta R_2^*$ and $\Delta R_1$ limit points based upon at least minimum $\Delta R_2^*$ and $\Delta R_1$ values of voxels of the cluster of voxels; and determine outlier voxels based upon a comparison of $\Delta R_2^*$ and $\Delta R_1$ of at least one of the plurality of voxels with respective values of the $\Delta R_2^*$ and $\Delta R_1$ limit points.

It is further envisioned that the program portion may be further configured to generate an outlier map including an underlay image and information based upon the determined outlier voxels overlayed thereon. It is also envisioned that the program portion may be further configured to render the outlier map on a display of the MRI system. Moreover, the program portion may be further configured to highlight the information based upon the determined outlier voxels in the outlier map. Moreover, it is envisioned that the program portion may be further configured to define an outlier region using at least the $\Delta R_2^*$ and $\Delta R_1$ limit points. Moreover, to determine the outlier voxels, the program portion may be configured to select all voxels in the outlier region to be the outlier voxels.

The invention is explained in further detail, and by way of example, with reference to the accompanying drawings wherein.

Figure 4:
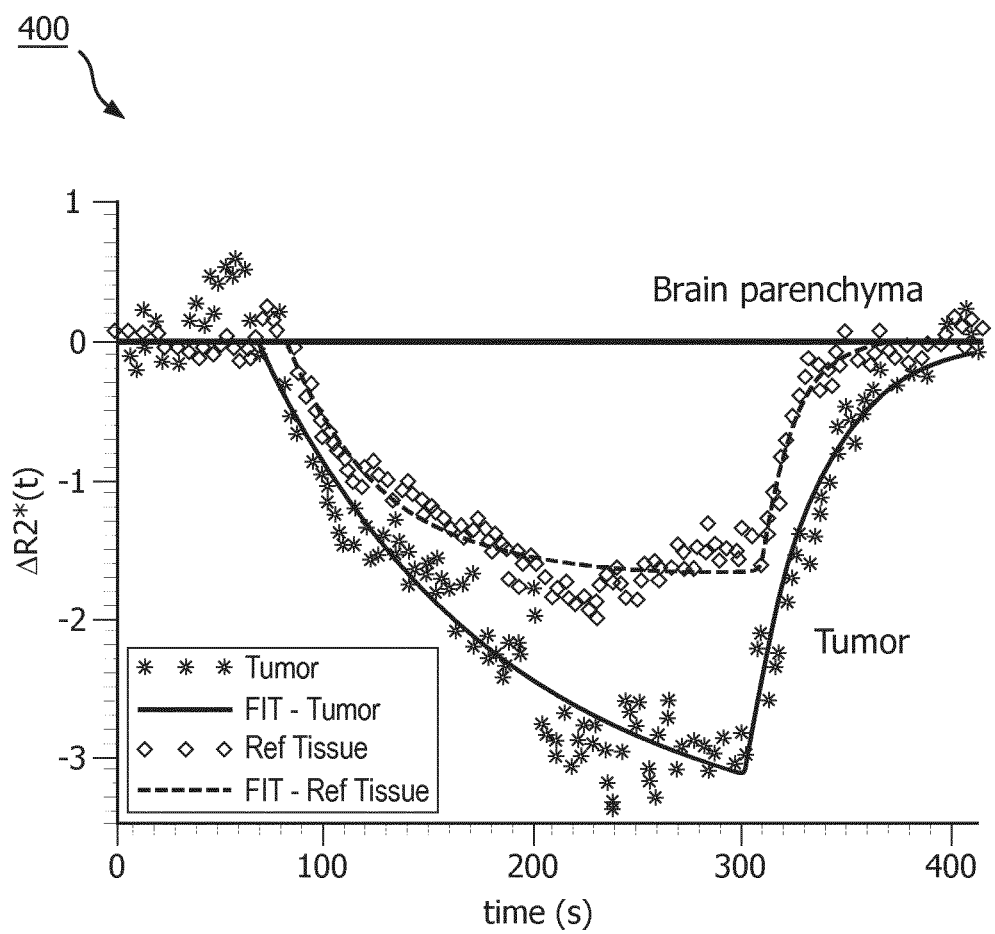
Figure 5:
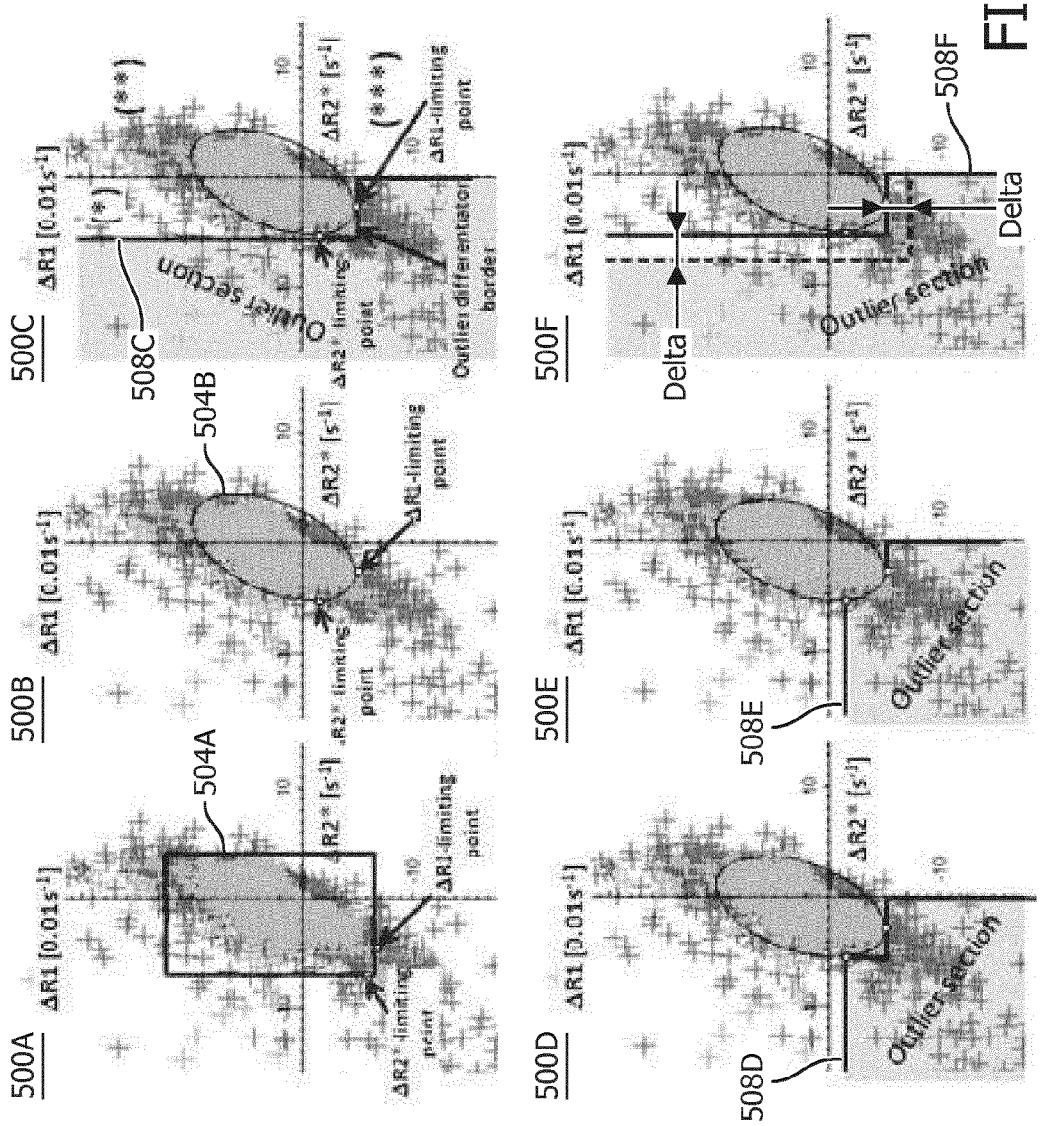
Figure 6:
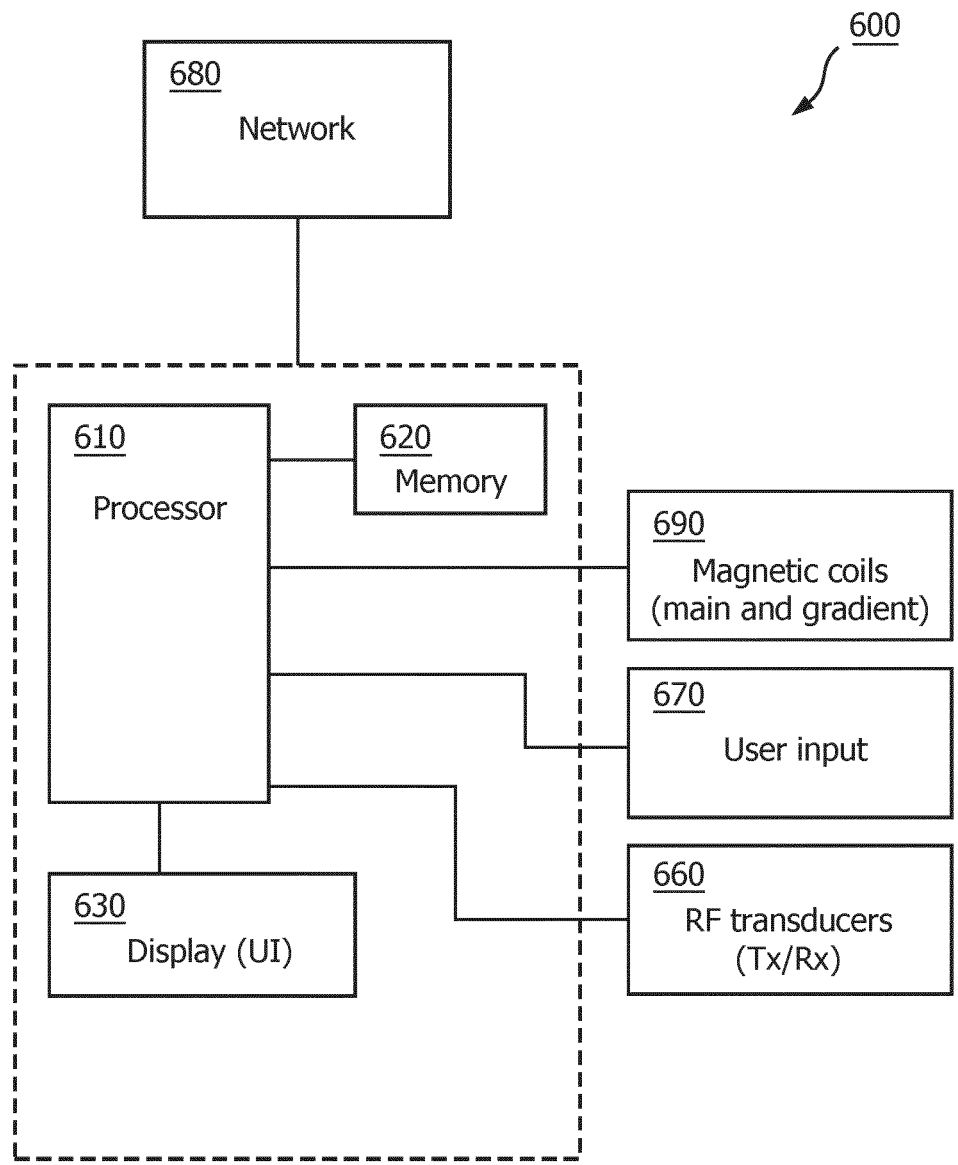

FIG. 4 shows a graph that illustrates an evolution of amplitudes of $\Delta R1$ and/or $\Delta R2^*$ responses over time in accordance with embodiments of the present system; and FIG. 5 shows graphs 600A through 600F each of which is an $\Delta R2^*$ $\Delta R1$ scatter plot in accordance with embodiments of the present system; and FIG. 6 shows a system in accordance with embodiments of the present system.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques and methods are omitted so as not to obscure the description of the present system. It should be expressly understood that the drawings are included for illustrative purposes and do not represent the scope of the present system. In the accompanying drawings, like reference numbers in different drawings may designate similar elements.

Figure 1:
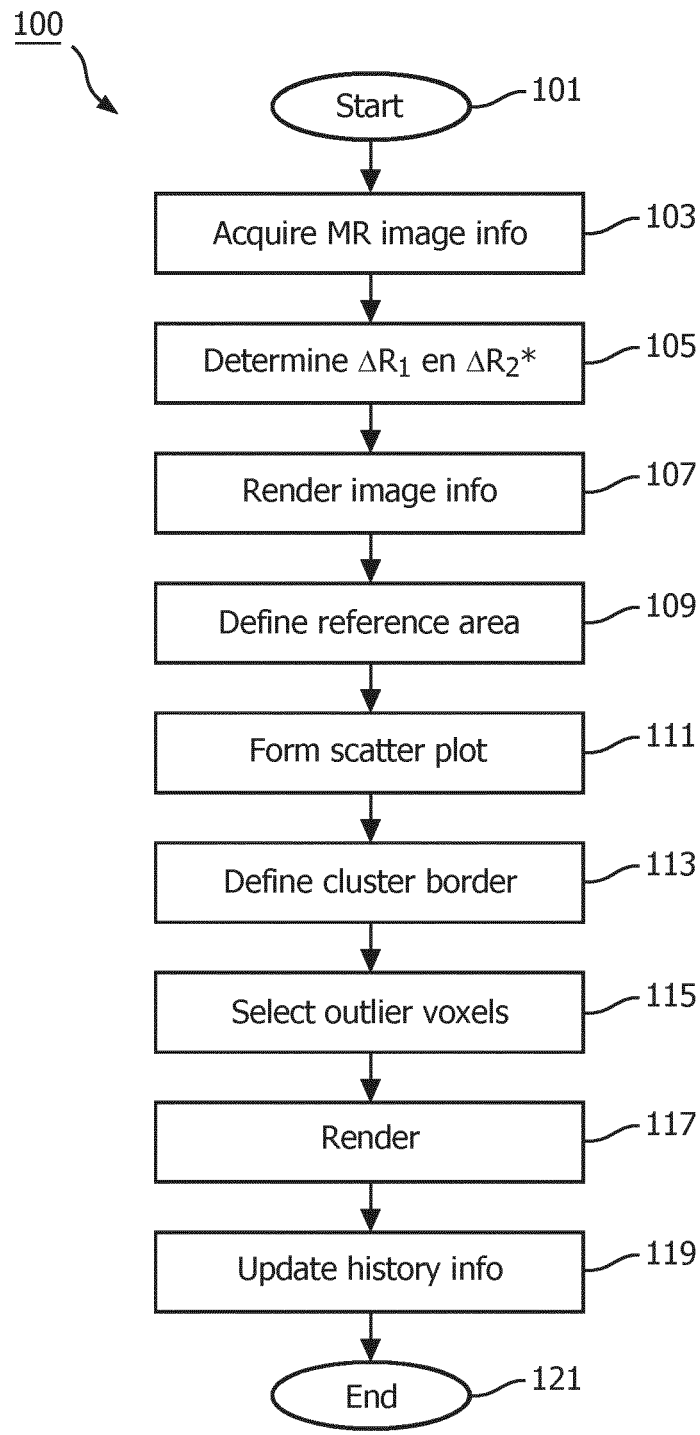
FIG. 1 is a flow diagram that illustrates a dynamic gas-enhanced MRI process performed on an MRI system in accordance with embodiments of the present system.

FIG. 1 is a flow diagram that illustrates a dynamic gas-enhanced MRI process 100 performed on an MRI system in accordance with embodiments of the present system. The process 100 may be performed using one or more computers communicating over a network and may obtain information from and/or store information to one or more memories which may be local and/or remote from each other. The process 100 can include one of more of the following acts. Further, one or more of these acts may be combined and/or separated into sub-acts, if desired. Further, one or more of these acts may be skipped depending upon settings. In operation, the process may start during act 101 and then proceed to act 103.

During act 103, the process may acquire magnetic resonance (MR) imaging information of a region of interest (ROI) during an MR oxygen-enhanced breathing challenge (hereinafter breathing challenge) administered to a subject under test (SUT) such as a human patient (e.g., a patient under test (PUT)). However, it should be understood that embodiments of the present system may be operative upon phantoms, animals, etc., with minimum changes. The MR imaging information may include a plurality of voxels of one or more image slices and/or information associated therewith.

The process may further include acts of controlling actuators to control a flow of gas such as air and/or oxygen-enhanced gases (e.g., $O_2$, $CO_2$, carbogen, etc.), to be supplied to the SUT during the breathing challenge in accordance with embodiments of the present system, if desired. The flow of the one or more gas may be provided in accordance with gas supply rules which may be stored in a memory of the system and/or may be set by a user. The process may obtain the gas supply rules from a memory of the system and may control an anesthesia system accordingly. Different exam types may have different gas supply rules associated therewith. The gas supply rules may set forth gas type (e.g., air, $O_2$, $CO_2$, carbogen, etc.), flow rates, flow times or duration, etc.). These rules may be associated with an exam type and may be stored in a memory of the system. For example, in a first exam type, the associated rules may require air to be administered for 1 minute, $O_2$ to be administered for 4 minutes, and then air to be administered for 1 minute. However, in a second exam type rather than providing $O_2$, $CO_2$ may be administered. In yet other embodiments, it is envisioned that the gas is administered manually.

Figure 2:
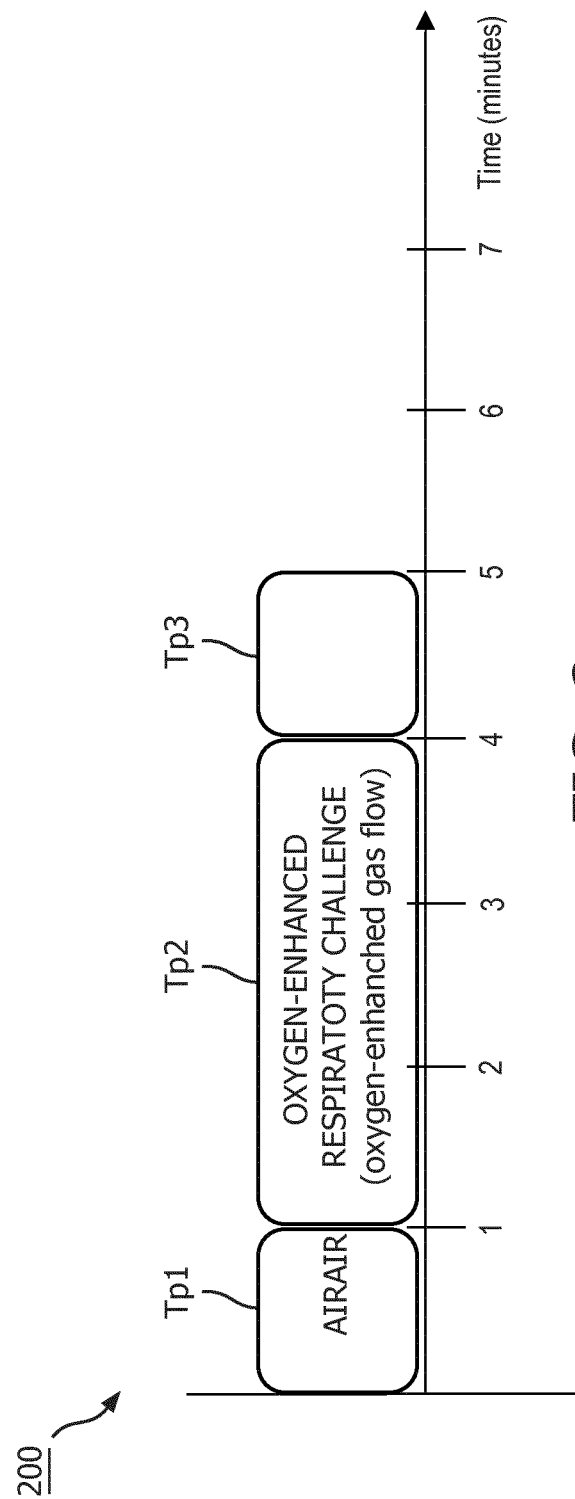
FIG. 2 is a graph illustrating a gas flow in accordance with embodiments of the present system.

FIG. 2 is a graph 200 illustrating a gas flow in accordance with embodiments of the present system. During a first time period TP1, air may be provided to the SUT for example for 1 minute. Then, during a second time period TP2 a selected oxygen-enhanced gas (e.g., $CO_2$, $O_2$, carbogen, etc.) may be supplied to the SUT. With reference to the test illustrated in graph 200, a carbogen mixture of 95% $O_2$ and 5% $CO_2$ may be administered to the SUT during a certain time period such as the second time period TP2 in which the oxygen-enhanced gas mixture is provided. However, in yet other embodiments, other oxygen-enhanced gas mixtures are also envisioned. Thereafter during a third time period TP3, air may illustratively be provided to the SUT. During these time periods, MR image information may be recorded. For example, during TP1 and TP3, baseline measurements may be obtained for comparison with measurements obtained during TP2. After completing act 103, the process may continue to act 105.

During act 105, the MR image information obtained during act 103 may be processed to determine $R_1$, $R_2^*$, $\Delta R_1$ and $\Delta R_2^*$ responses for each voxel in the ROI in response to the breathing challenge. The $\Delta R_1$ and $\Delta R_2^*$ responses are defined as the differences in amplitude in $\Delta R_1$ and $\Delta R_2^*$ between the asymptotic value reached during the oxygen breathing challenge (at the end of TP2 (e.g., see, FIG. 2)) and the baseline values (determined from the mean values measured during TP1 and TP3 (e.g., see, FIG. 2)). In some embodiments, the amplitudes may be obtained from the fit of an exponential model. However, in yet other embodiments other methods may be used to determine these amplitudes. For example, a difference between the mean value measured during the phase TP2 and the mean value measured during the phases TP1 and/or TP3 may be computed. Thus, the $\Delta R_2^*$ $\Delta R_1$ responses may reflect the changes in blood oxygenation ($\Delta R_2^*$) and the oxygen function ($\Delta R_1$) of tissue as a consequence of the oxygen breathing challenge, respectively. After completing act 105, the process may continue to act 107.

During act 107, the process may reconstruct and/or render the MR image information and/or information related to $\Delta R_2^*$, $\Delta R_1$, $R_2^*$, and/or $R_1$ responses for each voxel in the ROI on a user interface (UI) of the system such as a display. The process may render one or more graphs for the convenience of the user. This is better illustrated with reference to FIG. 3 which is a screen shot illustrating a series of graphs 300A through 300F generated in accordance with embodiments of the present system. More particularly, graphs 300A and 300B illustrate T2 weighed (T2w) and FLAIR (fluid attenuated inversion recovery), contrast MR images, respectively, of a brain of patient with a glioblastoma, obtained in accordance with embodiments of the present system. Further, graphs 300C and 300D illustrate parametric response maps of $\Delta R2^*$ and $\Delta R1$, respectively, (taken simultaneously) of a portion of the brain of the patient after 4 min of carbogen inhalation (e.g., 95% O2 and 5% $CO_2$). However, in yet other embodiments, other timing and/or gas type/mixtures for a breathing challenge may be used. If desired, the $\Delta R2^*$ and $\Delta R1$ responses may also be graphed over time as illustrated in FIG. 4 which shows a graph 400 that illustrates an evolution of $\Delta R1$ and/or $\Delta R2^*$ responses over time in accordance with embodiments of the present system. More particularly, graph 400 illustrates the response in each voxel by the average time series of the parameters in the ROI (e.g., $\Delta R2^*$(t) in FIG. 4)). Further, in yet other embodiment of the present system only a single graph such as the weighed (T2w) graph 300A is rendered so that a user may, if desired, interact with the system and may select the reference area (302) as will be described below. After completing act 107, the process may continue to act 109.

During act 109, the reference area (e.g., a reference region) 302 may be defined within the ROI of the MR image information. For example, this is better illustrated with reference to 300A of FIG. 3 which illustrates a reference area 302 (enclosed by dotted lines for illustration). The process may highlight the reference area 302 or portions thereof for the convenience of a user using any suitable method (e.g., dotted lines, colors, etc.). The process may provide a graphical user interface (GUI) with which a user may interact to select the reference area 302. Then, the process may select all voxels located in the reference area 302 to be reference voxels. The reference area 302 may be selected by the user and/or by the process and should include as many voxels of "normal" reference tissue as possible. For example, in some embodiments a controller of the system may employ a brain segmentation procedure, as is known in the art, which may programmed in accordance with embodiments of the present system to select a reference area in accordance with a brain segmentation. Thus, the reference area may be selected as an area or region of the ROI without any substantial tissue abnormalities. With regard to the shapes and/or sizes of the reference areas, in some embodiments, shapes such as circles, ellipses, rectangles, polygons, etc. may be used. However, in yet other embodiments, other shapes may also be used and/or provided. For example, in some embodiments, the process and/or user may define a plurality of (control) points (e.g., which may be user specified in number and/or location, etc.) which may be used by the process to perform a spline fitting of the reference region. After completing act 109, the process may continue to act 111.

During act 111, the process may form a ($\Delta R2^*$, $\Delta R1$) scatter plot of all voxels in the ROI in accordance with their $\Delta R2^*$ and $\Delta R1$ responses (e.g., amplitudes of $\Delta R2^*$ and $\Delta R$ responses) in accordance with embodiments of the present system. This is better illustrated with reference to graph 300E of FIG. 3 which is a ($\Delta R2^*$, $\Delta R1$) scatter plot of $\Delta R2^*$ and $\Delta R1$ responses of all voxels of the ROI in accordance with embodiments of the present system. The process may distinguish the reference voxels selected during act 109 from all other voxels using any suitable method such as by highlighting, color, and/or shape. For example, the reference voxels may be shown as "o's" and all other voxels (e.g., exclusive of the reference voxels) may be shown as "+'s". The reference voxels may be considered a reference voxel group. For the sake of clarity, the actual density of the reference voxels within the reference voxel group is not shown in the graph 300E. After completing act 111, the process may continue to act 113.

During act 113, the process may define a cluster border 304 of graph 300E which delineates a cluster of voxels selected from the reference voxels based upon their associated $\Delta R2^*$ and $\Delta R1$ responses. In other words, the cluster of voxels may include a group or subgroup of the reference voxels depending upon their associated $\Delta R2^*$ and $\Delta R1$ responses as processed by cluster rules. The cluster of voxels may be selected to including voxels from a multiparametric $\Delta R2^*$ vs $\Delta R1$ mapping of the plurality of voxels (e.g., a cluster in the ($\Delta R2^*$, $\Delta R1$) space). Thus, the cluster of voxels may include all (e.g., an entire group of) the reference voxels or a subgroup of the reference voxels. Accordingly, the ($\Delta R2^*$, $\Delta R1$) scatter plot of graph 300E may provide a multi-dimensional and local representation of tissue response to the oxygen challenge.

With regard to the cluster border 304, it may include various shapes such as ellipsoid (as shown), round, square, etc. and should be shaped and/or sized such that it surrounds at least a portion of a distribution of the reference voxels in the plot (reference cluster). Cluster rules may set forth methods to define the shape and/or size of the cluster border 304. For example, in some embodiments, the cluster rules define the cluster and/or cluster border such that the cluster border encircles all reference voxels in the ($\Delta R2^*$, $\Delta R1$) scatter plot or only a certain percentage (e.g., 95%) to account for noise or instabilities of a relaxometry method. Accordingly, the cluster rules may include mathematical methods, third-party applications, etc. which may be used to define the cluster border 304 and/or to select voxels to be included in the cluster of voxels.

FIG. 5 illustrates graphs 500A through 500F each of which is a ($\Delta R2^*$, $\Delta R1$) scatter plot in accordance with embodiments of the present system. These figures illustrate different clustering methods and different ways to define the limit points in accordance with embodiments of the present system. The graphs 500A through 500F are scatter plots each of which is similar to graph 300E of FIG. 3 and show all voxels of a ROI plotted in accordance with their associated $\Delta R2^*$ and $\Delta R1$ values and associated cluster borders 504$x$. More particularly, graph 500A shows a rectangular cluster border 504A and graph 500B shows an ellipsoid cluster border 504B. The cluster border (304,504$x$) may define minimum values of $\Delta R_2^*$ and $\Delta R_1$ responses for voxels which may be considered "normal." These minimum values of $\Delta R_2^*$ and $\Delta R_1$ responses may be known as $\Delta R_2^*$ and $\Delta R_1$ limiting points (hereinafter $\Delta R_2^*$ and $\Delta R_1$ limits, respectively or $\Delta R_{2lim}^*$ and $\Delta R_{1lim}$, respectively, for the sake of clarity). These $\Delta R_2^*$ and $\Delta R_1$ limits may be considered to be $\Delta R2^*$ and $\Delta R1$ thresholds, respectively. The $\Delta R_2^*$ and $\Delta R_1$ limits may then be used to determine an outlier differentiator border (e.g., see, 308 of FIGS. 3 and 508C, 508D, 508E, and 508F of FIG. 5) and/or to select outlying voxels as will be described below. Further, at each of the $\Delta R_2^*$ and $\Delta R_1$ limits, there may be a corresponding $\Delta R_1$ and $\Delta R_2^*$ value. In other words, at a $\Delta R_2^*$ limit, there is an associated $\Delta R_1$ value (e.g., for the same voxel) which will be known as $\Delta R_{1\_2lim}$. Similarly, at a $\Delta R_1$ limit, there is an associated $\Delta R_2^*$ value (for the same voxel) which will be known as $\Delta R_2^*{}_{\_1lim}$. After completing act 115, the process may continue to act 117.

During act 117, the process may select outlying voxels in accordance with outlier rules. The outlier rules may be set by the user and/or system. Voxels will be determined to be outliers when their $\Delta R_2^*$ and $\Delta R_1$ responses are determined to satisfy the conditions as set forth by the outlier rules. Several of these rules (e.g., rules A through D) are set forth below in Table 1. The user and/or system may select one or more of these rules.

Figure 3:
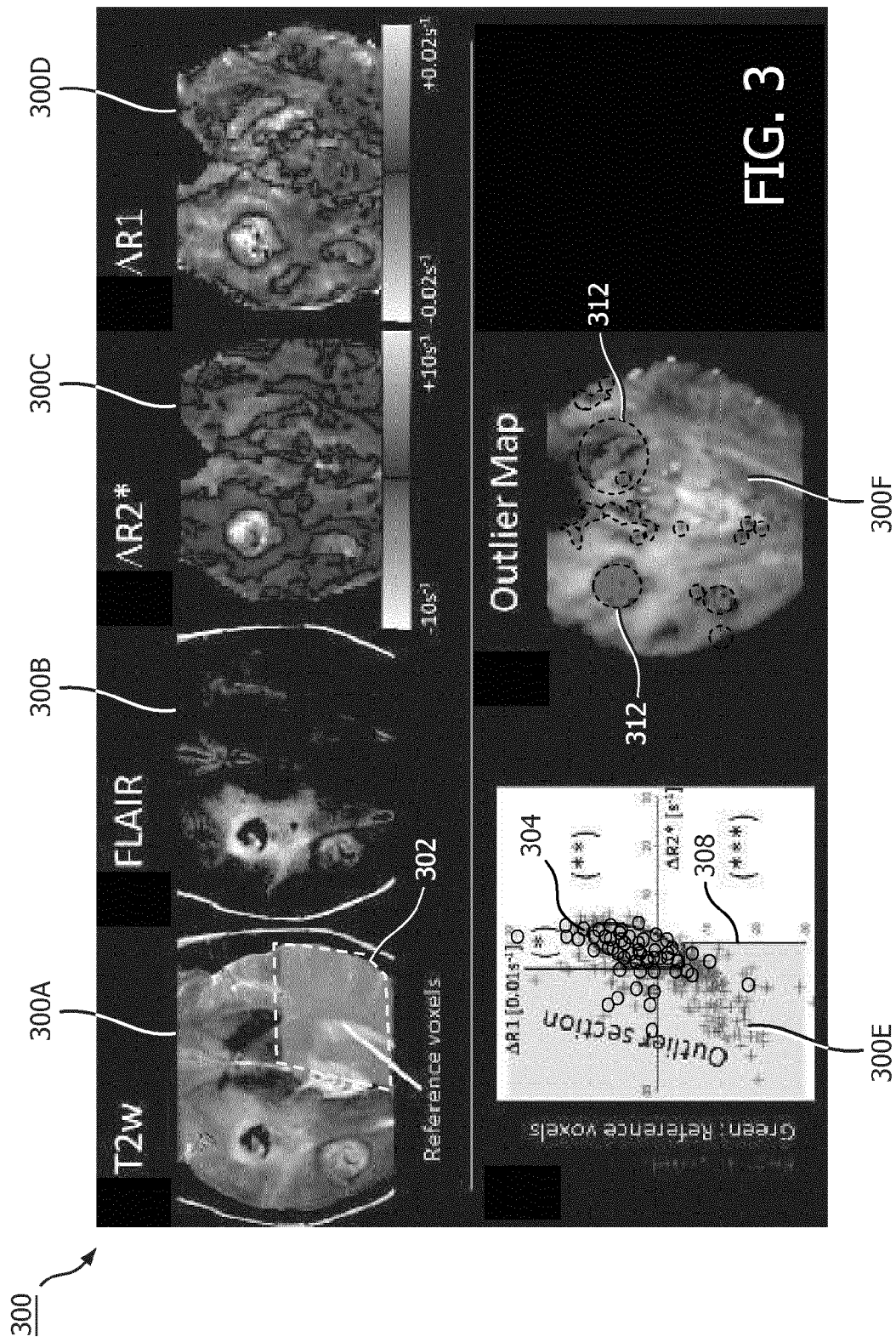
FIG. 3 is a screen shot illustrating a series of graphs 300A through 300F generated in accordance with embodiments of the present system.

Graphically, outlier voxels may be considered to be voxels which are located within an "outlier section" of a corresponding ($\Delta R2^*$, $\Delta R1$) scatter plot such as is illustrated in graph 300E of FIG. 3, and graphs 500C, 500D, 500E, and 500F of FIG. 5. The "outlier section" may be defined by values of $\Delta R_2^*$ and $\Delta R_1$ limits (e.g., $\Delta R_2^*$ and $\Delta R_1$ threshold values, respectively). Thus, the $\Delta R_2^*$ and $\Delta R_1$ limits may be selected as the lowest negative $\Delta R_2^*$ value and the lowest $\Delta R_1$ value of the cluster border, respectively, and may be used to define the minimum values of $\Delta R_2^*$ and $\Delta R_1$ of a corresponding voxel to be accepted (i.e., determined to be) as a normal (e.g., normoxic) voxel. Thus, voxels determined to be outlier voxels may be considered to be abnormal (e.g., non-normoxic voxels). There may be one or more outlier rules which may be used by the process to define an outlier voxel from the plurality of voxels. These outlier rules may be defined by the system and/or user and may be stored in memory of the system for later use. For example, in some embodiments, a voxel may be determined to be an outlier voxel if its $\Delta R_2^*$ value is determined to be less than the $\Delta R_2^*$ limit or if its $\Delta R_2^*$ value is determined to be negative and its $\Delta R_1$ value is determined to be less than the $\Delta R_1$ limit. However, in yet other embodiments other outlier rules are also envisioned.

The outlier section may be defined by an outlier differentiator border (308, 608x) which is defined by $\Delta R_2^*$ and $\Delta R_1$ limits as set forth by the outlier rules. In some embodiments, the cluster border may connect the $\Delta R_2^*$ and $\Delta R_1$ limits so as to form at least part of the outlier differentiator border.

Graphically, with reference to graphs 300E and 500x, in accordance with certain outlier rules, the outlier section may be defined as points "left" and "below" an "outlier differentiator border" which connects the $\Delta R_2^*$ and $\Delta R_1$ limits.

Outlier rules may be defined such that a voxel is defined as "outlier" when it is determined to satisfy the conditions as may be set forth by the (selected) outlier rules.

Voxel Outlier Rules

TABLE 1

Outlier Rules

| Rule/Graph | Voxel Response |
|---|---|
| A/500C | $\Delta R_2^* < \Delta R_{2lim}^*$ or ($\Delta R_2^* < 0$ (e.g., $\Delta R_2^*$ is negative) and $\Delta R_1 < \Delta R_{1lim}$) |
| B/500D | ($\Delta R_2^* < 0$ and $\Delta R_1 < R_{1lim}$) or ($\Delta R_2^* < \Delta R_{2lim}^*$ and $\Delta R_1 < \Delta R_{1\_2lim}$) |

Further, in accordance with yet other embodiments of the present system, the outlier differentiator border 508D may be modified such that it connects the two limiting points (e.g., the $\Delta R_2^*$ and $\Delta R_1$ limits) so as to provide a smoother outlier differentiator border as shown in graph 500E. Generally, the outlying voxels may be indicative of tissue having abnormal oxygen-function. Although several outlier rules are shown, others are also envisioned and may be set by the user and/or system.

In accordance with embodiments of the present system, voxels may be determined to be outlier voxels when it is determined that their distance to the outlier differentiator border exceeds a certain threshold distance such as distance Delta which may be defined by the system and/or user (e.g., see, 508F). After completing act 113, the process may continue to act 115.

Referring back to acts 113 and 115, in yet other embodiments, the reference cluster is not determined based on $\Delta R_2^*$ and $\Delta R_1$ values of the SUT but, rather, on statistical basis of larger patient or volunteer studies. Thus, the shape and size of a cluster border, $\Delta R_2^*$ and $\Delta R_1$ values of voxels within the cluster, $\Delta R_2^*$ limit point(s), the $\Delta R_1$ limit point(s), cluster border, and/or outlier differentiator border may be defined in accordance with the statistical basis of larger patient or volunteer studies (e.g., studies of SUTs).

In accordance with embodiments of the present system, a learning method may be configured to form and/or update information related to the reference cluster such as the shape, size, location, $\Delta R_2^*$ and $\Delta R_1$ values, $\Delta R_2^*$ limits, the $\Delta R_1$ limits and/or outlier differentiator border. Accordingly, the learning method may use an algorithm of a learning procedure to update this information based upon previous and current exams (e.g., breathing challenges, etc.).

Further, it is envisioned that in yet other embodiments various combinations of the above-mentioned or other methods may be used, as desired by the system and/or user.

For example, in some embodiments of the present system, the cluster border may be determined by applying automatic and/or robust fitting procedures. Further, in embodiments, a cluster border may be defined in whole or in part by a user who may interact with an interactive user interface (UI) provided by embodiments of the present system. This user interface may provide simple tools (e.g., graphical tools) such as an expandable ellipse which may be expanded, contracted, rotated, and/or reshaped by a user so as to form a reference cluster. For example, in this mode a user may adjust the size of the cluster border on a corresponding ($\Delta R_2^*$, $\Delta R_1$) scatter plot and a corresponding outlier map may be displayed simultaneously until a satisfactory cluster border has been selected by the user and/or system.

Referring to graphs 300E and 500C of FIGS. 3 and 5 respectively, regions labeled as (*), (), and (*) may include voxels having different characteristics. For example, some voxels in the region labeled (*) may be assumed to be caused by functional tissue with higher but normoxic blood volume; voxels in the regions labeled () may be assumed to be caused by an absence of blood and increased fluid content like edema or CSF and/or areas of predominant arterial blood supply and high blood oxygen saturation; and voxels in the region labeled (*) may be assumed to be caused by vascular steal effects. These voxels are thus not included in the outlier map in accordance with certain exemplary embodiments of the present system. This classification is built, for example, on insight obtained through experiments with brain tumor patients. After completing act 117, the process may continue to act 119.

During act 117, the process may form and/or render an outlier map. The outlier map may include image information related to locations of the outlier voxels and/or other image information. For example, in some embodiments, the process may form an outlier map by overlaying the outlier voxels upon an $R_2^*$ weighted image underlay as shown in the outlier map of graph 300F of FIG. 3. This map may be referred to as a parametric map. The process may highlight the outlier voxels using any suitable method such as colors, lines (e.g., dotted lines 312), etc. as may be set by the user and/or system. Further, in some embodiments, voxels of different sub-regions outside the reference region (e.g., 302) (e.g., see, regions (*), (), and/or (*)) can be highlighted and displayed as desired.

With regard to FIG. 3, graphs displayed in this figure may be updated in real time. Thus, for example, a user may adjust one or more parameters such as the shape, size, and/or location of a cluster border (e.g., 304) and outlier voxels may be selected, mapped, and/or rendered on a display of the system accordingly. Thus, in accordance with embodiments of the present system, a user may interact with the process in real-time to adjust various parameters of the process and may see results of this adjustment in real-time. After completing act 117, the process may continue to act 119.

During act 119, the process may update history information stored in a memory of the system in accordance with MR image information, results, etc. of the present process. For example, the process may store information that it uses and/or generates (e.g., results of determinations, MR image information, settings, parameters, etc.) in a memory of the system for later use, analysis, and/or other processing. In some embodiments an outlier map may be generated independently of other graphs. Further, the process may update history information and may store the history information with associated information such as day, date, time information, system parameters, user name, patient name, etc., so that a user or the system may easily obtain desired information at a later time. After completing act 121, the process may continue to act 123 where it ends.

FIG. 6 shows a portion of a system 600 in accordance with an embodiment of the present system. For example, a portion of the present system may include a processor 610 (e.g., a controller) operationally coupled to a memory 620, a display 630, sensors 640, RF transducers 660, magnetic coils 690, and a user input device 670. The memory 620 may be any type of device for storing application data as well as other data related to the described operation. The application data and other data are received by the processor 610 for configuring (e.g., programming) the processor 610 to perform operation acts in accordance with embodiments of the present system. The processor 610 so configured becomes a special purpose machine particularly suited for performing in accordance with embodiments of the present system.

The operation acts may include configuring an MRI system by, for example, controlling one or more of the magnetic coils 690, as well as the RF transducers 660 to output one or more desired signals. The magnetic coils 690 may include main magnetic coils (e.g., main coils, main magnets, magnets, DC coils, etc.), and the gradient coils (e.g., x-, y-, and z-gradient coils) and may be controlled to emit a main magnetic field and/or gradient fields in one or more desired directions and/or magnitudes (power). The processor 610 may control one or more drivers to drive to the magnetic coils 690 so that a desired magnetic field is emitted at a desired time. The RF transducers 660 may be controlled to transmit RF pulses at the test subject and/or to receive information such as MRI (echo) information therefrom. A reconstructor may process detected information such as the echo information and transform the detected echo information into content which may include image information (e.g., still or video images (e.g., video information)), data, and/or graphs may be rendered on, for example, a user interface (UI) of the present system such as on the display 630, a speaker, etc. Further, the content may then be stored in a memory of the system such as the memory 620 for later use. Thus, operation acts may include requesting, providing, and/or rendering of information such as, for example, reconstructed image information obtained from the echo information. The processor 610 may render the information on a UI of the system such as a display of the system. For example, the reconstructor may obtain label image and control image information (e.g., from RF transducers) and may then determine a difference between the label and control image information to obtain the image information based upon this difference which may be included in the content. Thus, the reconstructor may use any suitable image processing methods (e.g., digital signal processing (DSP), algorithms, echo-planar imaging methods, balanced steady-state free precision methods, etc. to process the control and/or label image information to obtain the content.

The sensors may be provided to obtain feedback information for use by the processor 610. The user input 670 may include a keyboard, a mouse, a trackball, or other device, such as a touch-sensitive display, which may be stand alone or be a part of a system, such as part of a personal computer, a personal digital assistant (PDA), a mobile phone, a monitor, a smart- or dumb-terminal or other device for communicating with the processor 610 via any operable link. The user input device 670 may be operable for interacting with the processor 610 including enabling interaction within a UI as described herein. Clearly the processor 610, the memory 620, display 630, and/or user input device 670 may all or partly be a portion of a computer system or other device such as an MR device.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 620 or other memory coupled to the processor 610.

The program and/or program portions contained in the memory 620 configure the processor 610 to implement the methods, operational acts, and functions disclosed herein. The memories may be distributed, for example between the clients and/or servers, or local, and the processor 610, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 610. With this definition, information accessible through a network is still within the memory, for instance, because the processor 610 may retrieve the information from the network for operation in accordance with the present system.

The processor 610 is operable for providing control signals and/or performing operations in response to input signals from the user input device 670 as well as in response to other devices of a network and executing instructions stored in the memory 620. The processor 610 may include one or more of a microprocessor, an application-specific or general-use integrated circuit(s), a logic device, etc. Further, the processor 610 may be a dedicated processor for performing in accordance with the present system or may be a general-purpose processor wherein only one of many functions operates for performing in accordance with the present system. The processor 610 may operate utilizing a program portion, multiple program segments, and/or may be a hardware device utilizing a dedicated or multi-purpose integrated circuit.

Further variations of the present system would readily occur to a person of ordinary skill in the art and are encompassed by the following claims. Accordingly, embodiments of the present system may provide a substantial tool for performing a comprehensive and valuable analysis of the complex information delivered by oxygen-enhanced MR for non-invasive tissue oxygenation measurements. For example, embodiments of the present system may include an MR oncology package which may be configured to perform operations of planning and/or dose painting of radiation therapy procedures (e.g. using an MR imaging system such as a Linac, etc.).

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

The invention claimed is:

1. A magnetic resonance imaging system for generating information indicative of an MR response to an oxygen breathing challenge, the MRI system comprising at least one controller configured to:

define a reference region within a region of interest of reconstructed MR image information including a plurality of voxels, the reference region comprising a plurality of reference voxels selected from the plurality of voxels, each of the plurality of voxels having associated $\Delta R_2^*$ and $\Delta R_1$ values;

select a cluster of voxels comprising voxels from at least the reference voxels from a multiparametric $\Delta R_2^*$ vs $\Delta R_1$ values;

determine $\Delta R_2^*$ and $\Delta R_1$ limit points based upon at least minimum $\Delta R_2^*$ and $\Delta R_1$ values of voxels of the cluster of voxels; and determine outlier voxels based upon a comparison of $\Delta R_2^*$ and $\Delta R_1$ of at least one of the plurality of voxels with a connection between the $\Delta R_2^*$ and $\Delta R_1$ limit points.

2. The MRI system of claim 1, wherein the at least one controller generates an outlier map comprising an underlay image and information based upon the determined outlier voxels overlayed thereon.

3. The MRI system of claim 2, further comprising at least a display wherein the at least one controller renders the outlier map on the display.

4. The MRI system of claim 3, wherein the at least one controller highlights the information based upon the determined outlier voxels.

5. The MRI system of claim 1, wherein the $\Delta R_2^*$ and $\Delta R_1$ limit points define at least part of an outlier region.

6. A method of generating information indicative of an MR response to an oxygen breathing challenge performed by a magnetic resonance imaging system, the method performed by at least one controller of the MR imaging system and comprising:

defining a reference region within a region of interest of reconstructed MR image information including a plurality of voxels, the reference region comprising a plurality of reference voxels selected from the plurality of voxels, each of the plurality of voxels having associated $\Delta R_2^*$ and $\Delta R_1$ values;

selecting a cluster of voxels comprising voxels from at least the reference voxels from a multiparametric $\Delta R_2^*$ vs $\Delta R_1$ mapping of the plurality of voxels;

determining $\Delta R_2^*$ and $\Delta R_1$ limit points based upon at least minimum $\Delta R_2^*$ and $\Delta R_1$ values of voxels of the cluster of voxels; and determining outlier voxels based upon outlier rules;

wherein the outlier rules include one of:

$\Delta R_2^* < \Delta R_{2lim}^*$ or ($\Delta R_2^* < 0$ and $\Delta R_1 < R_{1lim}$); and ($\Delta R_2^* < 0$ and $\Delta R_1 < R_{1lim}$) or ($\Delta R_2^* < \Delta R_{2lim}^*$ and $\Delta R_1 < R_{1\_2lim}$);

wherein $\Delta R_{2lim}^*$ is the $\Delta R_2^*$ limit point, $R_{1lim}$ is the $R_{1lim}$ limit point, and $R_{1\_2lim}$ is an $\Delta R_1$ value associated with the $\Delta R_{2lim}^*$ for a particular voxel.

7. The method of claim 6, further comprising an act of generating an outlier map comprising an underlay image and information based upon the determined outlier voxels overlayed thereon.

8. The method of claim 7, further comprising an act of rendering the outlier map on a display.

9. The method of claim 8, further comprising an act of highlighting the information based upon the determined outlier voxels.

10. The method of claim 6, wherein the act of determining the outlier voxels, comprises an act of selecting all voxels in the outlier region to be the outlier voxels.

11. A non-transitory computer readable memory medium, the carrying a computer program configured to generate information indicative of an MR response to an oxygen breathing challenge performed by a magnetic resonance imaging system having main coils, gradient coils, and radio frequency transducers, the computer program comprising:

a program portion configured to:
define a reference region within a region of interest of reconstructed MR image information including a plurality of voxels, the reference region comprising a plurality of reference voxels selected from the plurality of voxels, each of the plurality of voxels having associated $\Delta R_2^*$ and $\Delta R_1$ values;
select a cluster of voxels comprising voxels from at least the reference voxels from a multiparametric $\Delta R_2^*$ vs $\Delta R_i$ mapping of the plurality of voxels;
determine $\Delta R_2^*$ and $\Delta R_1$ limit points based upon at least minimum $\Delta R_2^*$ and $\Delta R_1$ values of voxels of the cluster of voxels; and
determine outlier voxels based upon a comparison of $\Delta R_2^*$ and $\Delta R_1$ of at least one of the plurality of voxels with a connection between the $\Delta R_2^*$ and $\Delta R_1$ limit points.

12. The non-transitory computer readable memory medium of claim 11, wherein the program portion is further configured to generate an outlier map comprising an underlay image and information based upon the determined outlier voxels overlayed thereon.

13. The non-transitory computer readable memory medium of claim 12, wherein the program portion is further configured to render the outlier map on a display of the MRI system.

14. The non-transitory computer readable memory medium of claim 13, wherein the program portion is further configured to highlight the information based upon the determined outlier voxels in the outlier map.

15. The non-transitory computer readable memory medium of claim 11, wherein the program portion is further configured to define an outlier region using at least the $\Delta R_2^*$ and $\Delta R_1$ limit points.

16. The non-transitory computer readable memory medium of claim 11, wherein to determine the outlier voxels, the program portion is configured to select all voxels in the outlier region to be the outlier voxels.

17. The MRI system of claim 1, wherein the at least one controller is further configured to:
provide an expandable ellipse to a display;
select the cluster of voxels based on a received input of the expandable ellipse.

18. The method of claim 6, wherein the outlier rules include:
$\Delta R_2^* < \Delta R_{2lim}^*$ or ($\Delta R_2^* < 0$ and $\Delta R_1 < R_{1lim}$);
wherein $\Delta R_{2lim}^*$ is the $\Delta R_2^*$ limit point, and $R_{1lim}$ is the $R_{1lim}$ limit point.

19. The method of claim 6, wherein the outlier rules include:
($\Delta R_2^* < 0$ and $\Delta R_1 < R_{1lim}$) or ($\Delta R_2^* < \Delta R_{2lim}^*$ and $\Delta R_1 < R_{1\_2lim}$);
wherein $R_{1lim}$ is the $R_{1lim}$ limit point, $\Delta R_{2lim}^*$ is the $\Delta R_2^*$ limit point, and $R_{1\_2lim}$ is an $\Delta R_1$ value associated with the $\Delta R_{2lim}^*$ for a particular voxel.

20. The method of claim 6, wherein the determining further comprises determining outlier voxels based upon a comparison of $\Delta R_2^*$ and $\Delta R_1$ of at least one of the plurality of voxels with a connection between the $\Delta R_2^*$ and $\Delta R_1$ limit points.

* * * * *